(12) United States Patent
SeyedzadehDelcheh et al.

(10) Patent No.: US 12,175,087 B2
(45) Date of Patent: Dec. 24, 2024

(54) METHOD AND APPARATUS FOR PROTECTING MEMORY DEVICES VIA A SYNERGIC APPROACH

(71) Applicant: ADVANCED MICRO DEVICES, INC., Santa Clara, CA (US)

(72) Inventors: SeyedMohammad SeyedzadehDelcheh, Sammamish, WA (US); Vamsee Reddy Kommareddy, Orlando, FL (US)

( * ) Notice: Subject to any disclaimer, the term of this patent is extended or adjusted under 35 U.S.C. 154(b) by 106 days.

(21) Appl. No.: 17/487,961

(22) Filed: Sep. 28, 2021

(65) Prior Publication Data

US 2023/0114414 A1 Apr. 13, 2023

(51) Int. Cl.
*G06F 11/00* (2006.01)
*G06F 3/06* (2006.01)
*G06F 11/10* (2006.01)
*G11C 29/00* (2006.01)
*G11C 29/18* (2006.01)

(52) U.S. Cl.
CPC .......... *G06F 3/0614* (2013.01); *G06F 3/0655* (2013.01); *G06F 3/0673* (2013.01); *G06F 11/1048* (2013.01); *G11C 29/18* (2013.01); *G11C 29/76* (2013.01)

(58) Field of Classification Search
CPC .................................................. G06F 11/1048
See application file for complete search history.

(56) References Cited

U.S. PATENT DOCUMENTS

| | | | | |
|---|---|---|---|---|
| 4,694,412 A * | 9/1987 | Domenik | ............. | G07F 7/1008 380/46 |
| 5,793,318 A * | 8/1998 | Jewett | ................ | H03M 1/0641 341/89 |
| 6,925,086 B2 * | 8/2005 | Curtis | .................. | H04L 49/901 370/428 |
| 7,606,249 B1 * | 10/2009 | Swenson | ................ | H04L 47/50 711/119 |
| 9,594,853 B2 * | 3/2017 | Natarajan | ............. | G06F 16/215 |
| 10,170,174 B1 * | 1/2019 | Ito | ..................... | G11C 11/40615 |
| 10,950,292 B1 | 3/2021 | Seyedzadehdelcheh et al. | | |
| 2003/0005219 A1 * | 1/2003 | Royer, Jr. | .......... | G06F 12/0866 711/E12.019 |

(Continued)

OTHER PUBLICATIONS

Flipping Bits in Memory Without Accessing Them: An Experimental Study of DRAM Disturbance Errors, by Yoongu Kim, 2014 https://users.ece.cmu.edu/~yoonguk/.*

(Continued)

*Primary Examiner* — Amine Riad

(57) ABSTRACT

A synergistic approach to mitigating crosstalk in a Dynamic Random-Access Memory (DRAM) implements the use of a random number generator to increment a counter in a probabilistic manner. The counter is formed by reclaiming bytes of a double data rate (DDR) fault isolation feature. The random number generator value may be compared against a predetermined parameter value and a determination may be made whether or not to extract and increment the counter based on a result of the comparison. A logic controller compares the counter value to a predetermined hotness threshold parameter and a flag is set based on an existence of an address match in local memory. Based on the results of the comparison, access to the DRAM is reduced.

20 Claims, 4 Drawing Sheets

(56) References Cited

U.S. PATENT DOCUMENTS

| | | | |
|---|---|---|---|
| 2006/0029229 A1* | 2/2006 | Trifonov | H04L 9/0852 380/256 |
| 2006/0146587 A1* | 7/2006 | Chang | G11C 7/02 365/189.06 |
| 2013/0297879 A1* | 11/2013 | Abali | G06F 12/121 711/128 |
| 2014/0122811 A1* | 5/2014 | Shwartsman | G06F 11/1064 711/144 |
| 2014/0195576 A1* | 7/2014 | Kaplan | G06F 7/588 708/250 |
| 2014/0281206 A1* | 9/2014 | Crawford | G11C 11/40611 711/106 |
| 2016/0028544 A1* | 1/2016 | Hyde | H04L 9/0662 711/112 |
| 2016/0180900 A1* | 6/2016 | Kilmer | G11C 7/103 711/105 |
| 2017/0117030 A1* | 4/2017 | Fisch | G11C 11/4078 |
| 2019/0179764 A1* | 6/2019 | Wang | G06F 12/0891 |
| 2019/0228813 A1 | 7/2019 | Nale et al. | |
| 2019/0361677 A1* | 11/2019 | Tu | G06F 7/584 |
| 2020/0233591 A1* | 7/2020 | Sethumadhavan | G06F 21/604 |
| 2021/0049269 A1 | 2/2021 | Ghosh et al. | |
| 2021/0216452 A1* | 7/2021 | Muralidhara | G06F 12/0895 |
| 2022/0115946 A1* | 4/2022 | Chen | H02P 6/085 |
| 2022/0207190 A1* | 6/2022 | Chhabra | H04W 12/10 |
| 2022/0318158 A1* | 10/2022 | Durham | G06F 12/1009 |
| 2022/0383935 A1* | 12/2022 | You | G06F 12/0246 |
| 2023/0162778 A1* | 5/2023 | Ayyapureddi | G11C 11/40622 365/222 |
| 2023/0185709 A1* | 6/2023 | Fukuda | G06F 3/0616 711/154 |

OTHER PUBLICATIONS

PCT/US2022/045046, "International Search Report and Written Opinion", PCT Application No. PCT/US2022/045046, dated Mar. 17, 2023, 19 pages.

Yoongu Kim et al., Flipping Bits in Memory Without Accessing Them: An Experimental Study of DRAM Disturbance Errors, 2014 ACM/IEEE 41st International Symposium on Computer Architecture (ISCA), 2014, pp. 361-372.

Sheng-Hua Zhou et al., An Ultra-low power CMOS random number generator, Solid-State Electronics, vol. 52, Issue 2, 2008, pp. 233-238.

Zelalem Birhanu Aweke et al., ANVIL: Software-Based Protection Against Next-Generation Rowhammer Attacks, ACM SIGARCH Computer Architecture News, vol. 44, Issue 2, May 2016, pp. 743-755.

Syedmohammad Seyedzadeh et al., Mitigating Wordline Crosstalk Using Adaptive Trees of Counters, Proceedings of the 45th Annual International Symposium on Computer Architecture, Jun. 2018, pp. 612-623.

Dae-Hyun Kim et al., Architectural Support for Mitigating Row Hammering in DRAM Memories, IEEE Computer Architecture Letters, vol. 14, No. 1, pp. 9-12, 2015.

Yeonhong Park et al., Graphene: Strong yet Lightweight Row Hammer Protection, 2020 53rd Annual IEEE/ACM International Symposium on MicroArchitecture (MICRO), 2020, pp. 1-13.

PCT/US2022/045046, "International Preliminary Report on Patentability", International Application No. PCT/US2022/045046, Apr. 11, 2024, 13 pages.

* cited by examiner

METHOD AND APPARATUS FOR PROTECTING MEMORY DEVICES VIA A SYNERGIC APPROACH

TECHNICAL FIELD

Various embodiments relate generally to the mitigation of crosstalk in memory devices, and more specifically, to a method and apparatus for reducing the effect of crosstalk in systems having dynamic random-access memory.

BACKGROUND

In all computing systems, from desktop computers and mobile to servers and cloud platforms, main memory is a critical component. The low cost and relatively low latency of the Dynamic Random-Access Memory (DRAM) make it the predominant data storage technology used to build main memory. DRAM technology process scaling has enabled reductions in the DRAM cell size to increase memory capacity and performance. As the size of the DRAM cell shrinks, the capacitor and the access transistor in the DRAM become less reliable and generally more vulnerable to electrical noise and disturbance, more commonly known as crosstalk.

Crosstalk reliability problems, caused by the DRAM technology process scaling leads to security vulnerabilities. For example, repeatedly reading or accessing the same row in DRAM can corrupt data in physically adjacent rows. More specifically, when a DRAM row is accessed repeatedly within a single DRAM refresh interval, a process also known as row hammering, one or more bits in physically adjacent rows may be flipped to the wrong value. A row hammering attack may result in the compromise and control of data stored in main memory Various solutions exist to mitigate crosstalk. Many of these solutions are expensive because they sacrifice chip area for enhanced performance and reliability. An improved solution that does not sacrifice capacity for performance is desired.

SUMMARY

Apparatus and associated methods relate to a probabilistic and deterministic ram access monitor (PADRAM) which mitigates crosstalk by reducing the number of accesses to DRAM memory. PADRAM keeps track of the rows of the DRAM that are frequently accessed, referred to as hot rows, by using part of an existing fault isolation feature of the DRAM as a counter and incrementing the counter in a probabilistic manner by using a random number generator. The counter value determines whether or not a DRAM row is accessed based on a hotness threshold or hot threshold parameter. The hotness threshold is set to guarantee that the total number of DRAM accesses for a word does not exceed a row hammering threshold. The row hammering threshold may be defined as the minimum number of word line accesses to the DRAM which may be made before an error occurs. In this disclosure, DRAM is synonymous with double data rate (DDR) memory which may also be referred to as DDR synchronous DRAM or DDR SDRAM.

In one embodiment, a computer system comprises at least one processor and a DRAM operatively coupled to the processor. The computer system also includes a memory controller operatively coupled to the processor. The memory controller includes an apparatus configured to mitigate crosstalk in the DRAM array. The computer system also includes a plurality of data packets. Each data packet represents a line of memory and is configured to include a counter that tracks access to each row in the DRAM array.

In another embodiment, an apparatus in a memory controller comprises a counter embedded in a data packet structure that counts a number of accesses to a main memory. A random number generator increments the counter in a probabilistic manner based on a probability parameter. The apparatus includes a static random-access (SRAM) register configured for access responsive to a row address match. A logic controller controls whether or not access is made to the SRAM register or main memory.

In yet another embodiment, a method implemented at a memory controller comprises receiving a row address and determining based on the row address whether to access an on-chip memory or a DRAM array; whether a row address match exists in an on-chip memory. If a row address match exists in on-chip memory, the cache line of the data packet corresponding to the row address is written to the on-chip memory and all accesses to a DRAM array are bypassed. If a row address miss occurs, the DRAM array is accessed with the cache line of the data packet based on a first condition and a second condition.

Various embodiments may achieve one or more advantages. In one exemplary aspect, the performance overhead of the memory may be reduced by the use of a random number generator to increment the counter in a probabilistic manner instead of incrementing in a deterministic manner with each read or write access to the DRAM. Incrementing the counter probabilistically reduces the cost of performance overhead since it is unnecessary to increment the counter with each read and write access. Additionally, an attacker is less able to predict or calculate the frequency of a DRAM access.

In another exemplary aspect, the reclaimed bits of the DDR fault isolation feature are used as a counter to track read and write accesses to each DRAM row. The 4 bytes, or 32 bits that are reclaimed from the error correcting portion (ECC) of the data packet may be extracted and incremented by the random number generator based on certain conditions. The use of the reclaimed bits as a counter conserves chip capacity since chip area is not consumed by hardware counters implemented on chip to track access for each row memory.

In yet another exemplary aspect, a logic controller may check whether or not a flag that indicates the presence of data in on-chip memory is set. If the flag is set, the memory controller may perform read and write accesses to the SRAM register. For example, if the flag is set, the memory controller first checks if a requested row address is available in the SRAM. If available, the cache line data may be read from the SRAM to a requesting component or the cache line data may be written to the SRAM. The accesses to the SRAM reduce the number of accesses to the DRAM and thereby mitigates crosstalk.

The details of various embodiments are set forth in the accompanying drawings and the description below. Other features and advantages will be apparent from the following detailed description taken in conjunction with the accompanying drawings and claims.

BRIEF DESCRIPTION OF THE DRAWINGS

For a more complete understanding of the disclosure and the advantages thereof, reference is now made to the accompanying drawings wherein similar or identical reference numerals represent similar or identical items.

DETAILED DESCRIPTION OF ILLUSTRATIVE EMBODIMENTS

Figure 1:
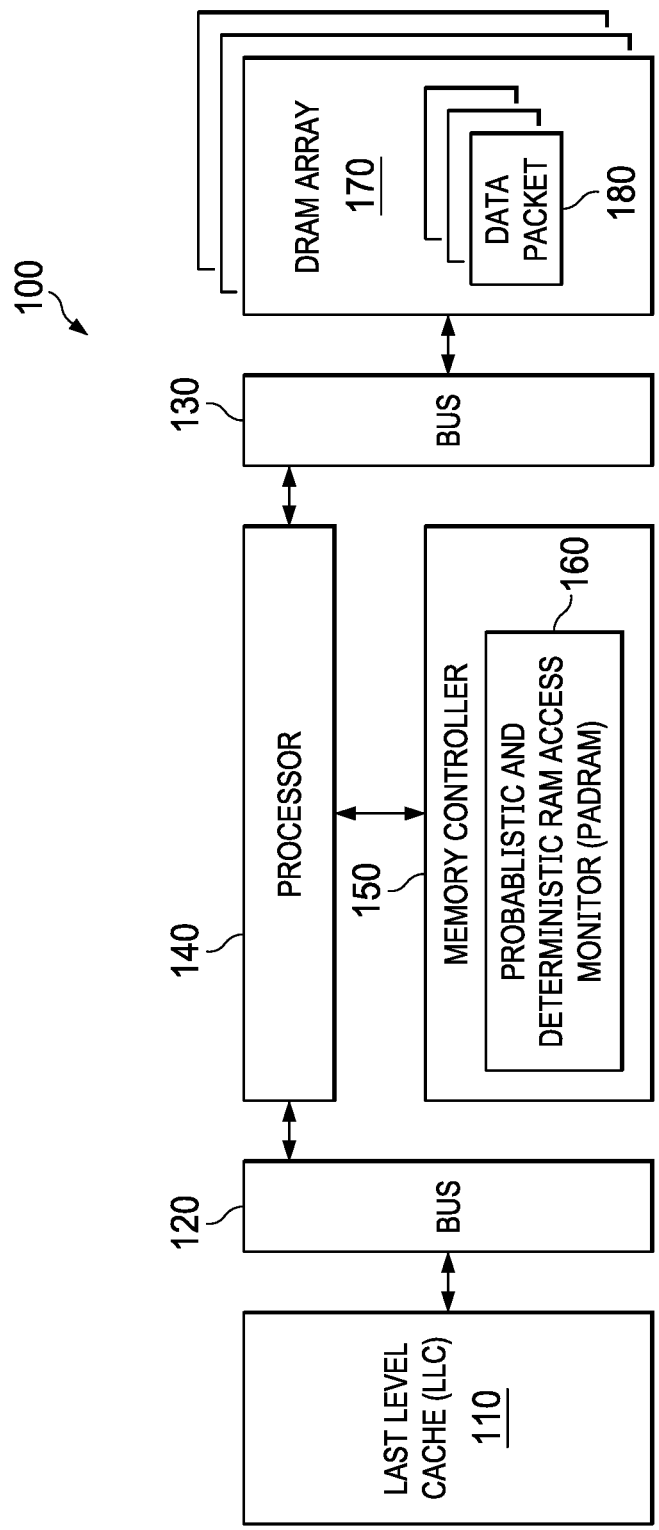
FIG. 1 depicts a high-level block diagram of an exemplary computer system in accordance with an illustrative embodiment.

Apparatus and associated methods relate to a mechanism that mitigates crosstalk in a DRAM array by using a synergistic approach. The term synergistic implies the use of two or more elements being combined to function as a unit to achieve a certain objective. In embodiments of the disclosure, a deterministic approach is combined with a probabilistic approach to reduce the row hammering effect of crosstalk in DRAM. More specifically, a counter, considered to be deterministic element, is used with a random number generator, considered to be a deterministic element, to reduce the row hammering effect of crosstalk in DRAM.

A counter may be considered to be a deterministic element because of the predictability of its outputs. For example, a counter output may start with a value of 1 and increment upward in a sequential linear fashion to a value of 2, 3 and so on. Thus, the counter output may be considered predictable.

A random number generator may be considered to be a probabilistic element because its outputs are not predictable. The output values of a random number generator are not predictable since a future output value may not be based on a current or previous value. The random number generator may output numbers within a particular range where each number in the range has a certain probability of occurring or not. Thus, the random number generator outputs may be considered as indeterminable and not predictable.

In this disclosure, the output of the random number generator is used to increment a counter in a probabilistic manner. The memory controller uses a comparison between the counter output and a hotness threshold to determine whether or not to access a DRAM row. Because the counter is not incremented in a predictable manner, it is impossible to determine when a DRAM row may be accessed by an attacker.

Each data packet of the DRAM array is configured to include its own counter to track the number of times the corresponding row is accessed. The counter is incremented at intervals based on the result of a comparison between a number output by the random number generator and a predetermined probability parameter, $P_{PROB}$, specific to the DRAM array in an implementation.

If the output of the random number generator is greater than $P_{PROB}$, this indicates the DRAM may accessed for reading and writing. Data may be fetched or read from the DRAM and sent to a last level cache (LLC) and the on-chip memory SRAM. In cases of a write, data may be written to the DRAM.

The counter value may also be compared to a hot threshold parameter, $THRES_{HOT}$ specific to a DRAM array implementation. If the counter value is greater than $THRES_{HOT}$, this indicates the DRAM row is being accessed frequently, or hammered, and is subject to crosstalk disturbances. $THRES_{HOT}$ is based on a row hammering threshold and a number of cache lines in a word line of the DRAM.

As data is stored in the SRAM register, a flag is set to indicate the probable presence of data is the SRAM. As long as the flag is set, the memory controller will first access the SRAM register. The memory controller will only need to access the DRAM if the information requested is missing from the on-chip register or SRAM. When data is fetched from the DRAM for the requesting component, a copy may also be stored in the SRAM for future use.

Turning to FIG. 1, a high-level block diagram depicts an exemplary computer system 100 in accordance with an illustrative implementation of the disclosure. The computer system 100 includes a processor 140 in communication with a memory controller 150. The process 140 and memory controller 150 communicate with an external memory, such as, the Last Level Cache (LLC) 110 and a DRAM array 170 through bus 120 and bus 130. Memory controller 150 may include a group of components that operationally monitor and control access to the LLC 110 and the DRAM array 170. In this disclosure, this group of components may be referred to as a probabilistic and deterministic ram access monitor, PADRAM 160. The objective of PADRAM 160 is to reduce the number of read and write accesses to the DRAM array 170.

In general, repeatedly accessing the same row in a DRAM can corrupt data in physically adjacent rows by a phenomenon known as row hammering. By way of example, and not limitation, populating a DRAM with all |1|'s and repeatedly reading from DRAM rows to ensure repeated activation of the row, may result in some or all of the bits being flipped to all |0|'s. PADRAM reduces the number of accesses to the DRAM array 170 by storing cache line data on-chip so that it is available for access by components without accessing the DRAM array 170.

PADRAM 160 works in conjunction with a fault isolation architectural feature of the DRAM 170 that reclaims a portion of the data packet for use as a counter that keeps track of whether or not a particular DRAM row has high access.

Figure 2:
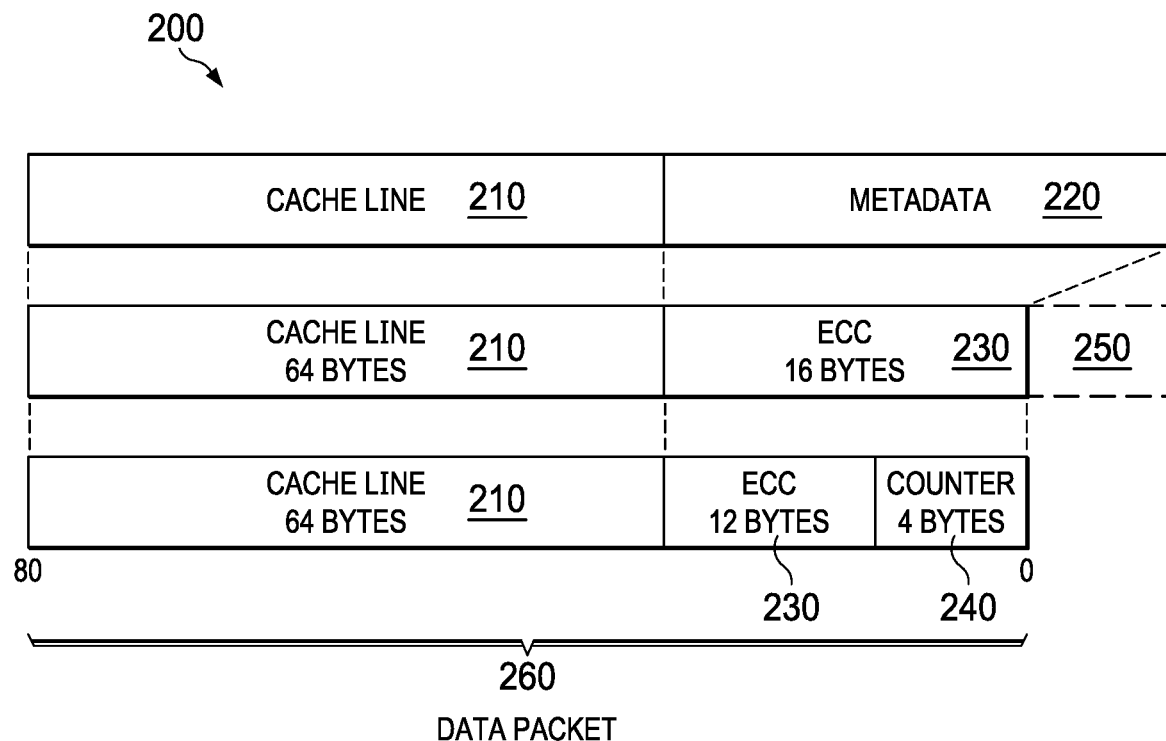
FIG. 2 depicts a block diagram of a modified data packet using fault isolation features in accordance with an illustrative embodiment.

Turning next to FIG. 2, a block diagram of a modified data packet 200 having the fault isolation architectural feature is illustrated in accordance with an illustrative embodiment of the disclosure. Each data packet 200 of the DRAM may be comprised of 64 bytes cache line 210 and metadata 220. A first portion 230 of the metadata 220 may be used for a fault isolation feature. A second portion 250 of the metadata 220 may be used for other information such as, without limitation, flag indicators and the like. More specifically, the first portion of the metadata 230 may be comprised of 16 bytes of an error correcting code (ECC). Four bytes of the ECC may be reclaimed for use as a 32-bit or 4-byte counter 240. In sum, the data packet 260 of 80 bytes may comprise a cache line portion 210 of 64 bytes, an ECC portion 230 of 12 bytes and a counter portion 240 of 4 bytes.

The counter bits of counter 240 may be extracted and incremented in a probabilistic manner in accordance with the conditions provided by the PADRAM 160 of FIG. 1. Thus, the counter is able to track accesses to DRAM rows by a software implementation without sacrificing capacity by providing an architectural or hardware implementations of a counter for each row.

Figure 3:
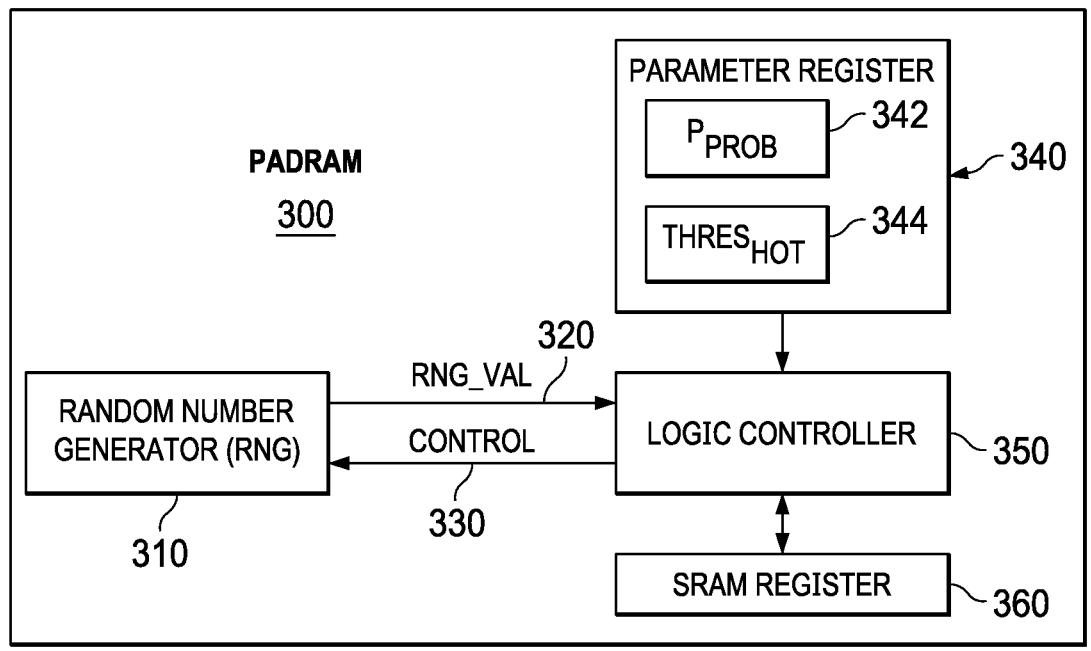
FIG. 3 depicts a block diagram of an apparatus used to mitigate crosstalk in accordance with an illustrative embodiment.

FIG. 3 depicts a block diagram of an apparatus used to mitigate crosstalk in accordance with an illustrative embodiment. In an embodiment, the monitor system PADRAM 300 may comprise a parameter register 340, a random number generator 310, logic controller 350, and SRAM register 360. In operation, the random number generator 310 may receive control signals 330, such as reset, clock, or other signals as may be recognized by one of ordinary skill in the art, from the logic controller 350. The random number generator 310 may generate a value, rng_val 320, which may be used to increment a counter, such as counter 240 of FIG. 2, based on a probability parameter loaded in the parameter register 340.

The parameter register 340 may be loaded with memory parameters that are predetermined and based on a specific configuration or design of main memory or DRAM memory bank (not shown) being implemented in a computer system, such as the computer system 100 of FIG. 1. More specifically, the parameter register 340 may include parameters, such as a probability parameter $P_{PROB}$ 342 and a hot threshold parameter $THRES_{HOT}$ 344.

$P_{PROB}$ 342 may be selected based on the number of word lines in a DRAM bank to guarantee that a counter value does not exceed the hot threshold parameter $THRES_{HOT}$ 344 for memory intensive workloads having random memory accesses. More specifically, by way of example and not limitation, in a case where the number of accesses for a DRAM may be represented by N and the number of rows of a DRAM by R, for each row the number of random accesses may be represented by N/R. The parameter $P_{PROB}$ 342 has an inverse relation to the number of random accesses represented by 1/(N/R). Parameter $P_{PROB}$ 342 may be selected ahead of any memory operations and loaded into the parameter register. The value of $P_{PROB}$ has a value that is greater than a specific number of accesses per row, $P_{PROB} > 1/(N/R)$.

Parameter $P_{PROB}$ 342 may determine whether or not the counter, such as counter 240, is incremented. The memory controller (not shown) may compare the value of $P_{PROB}$ 342 to the random number generator value, rng_val 320. The value of counter 240 may be extracted and incremented when rng_val 320 is less than $P_{PROB}$ 342.

The hot threshold parameter $THRES_{HOT}$ 344 provides an upper bound on memory accesses to a row before a row may be subject to attack. $THRES_{HOT}$ 344 may be selected based on a row hammering threshold, $T_{RH}$, and the number of cache lines in the word line. For example, if there are M distinct cache lines per word line, $THRES_{HOT}$ 344 may be selected based on $T_{RH}/M$, where $THRES_{HOT}$ 344 is selected to be less than $T_{RH}/M$, $THRES_{HOT} < T_{RH}/M$ to guarantee that the total number of word line activations for accessing cache lines within the word line never exceeds $T_{RH}$.

The logic controller 350 is configured to operationally monitor the contents of the SRAM register 360. Logic controller 350 may set a flag (not shown) to indicate the absence or presence of data for a row of the SRAM register 360. For example, if a cache line is written to a row in SRAM, the flag may be set to indicate that the memory location is not empty. The memory controller (not shown) may fetch a data packet from the SRAM 360 and send it to a Last Level Cache (LLC) (not shown) or other requesting component without accessing main memory, such as a DRAM (not shown).

Figure 4:
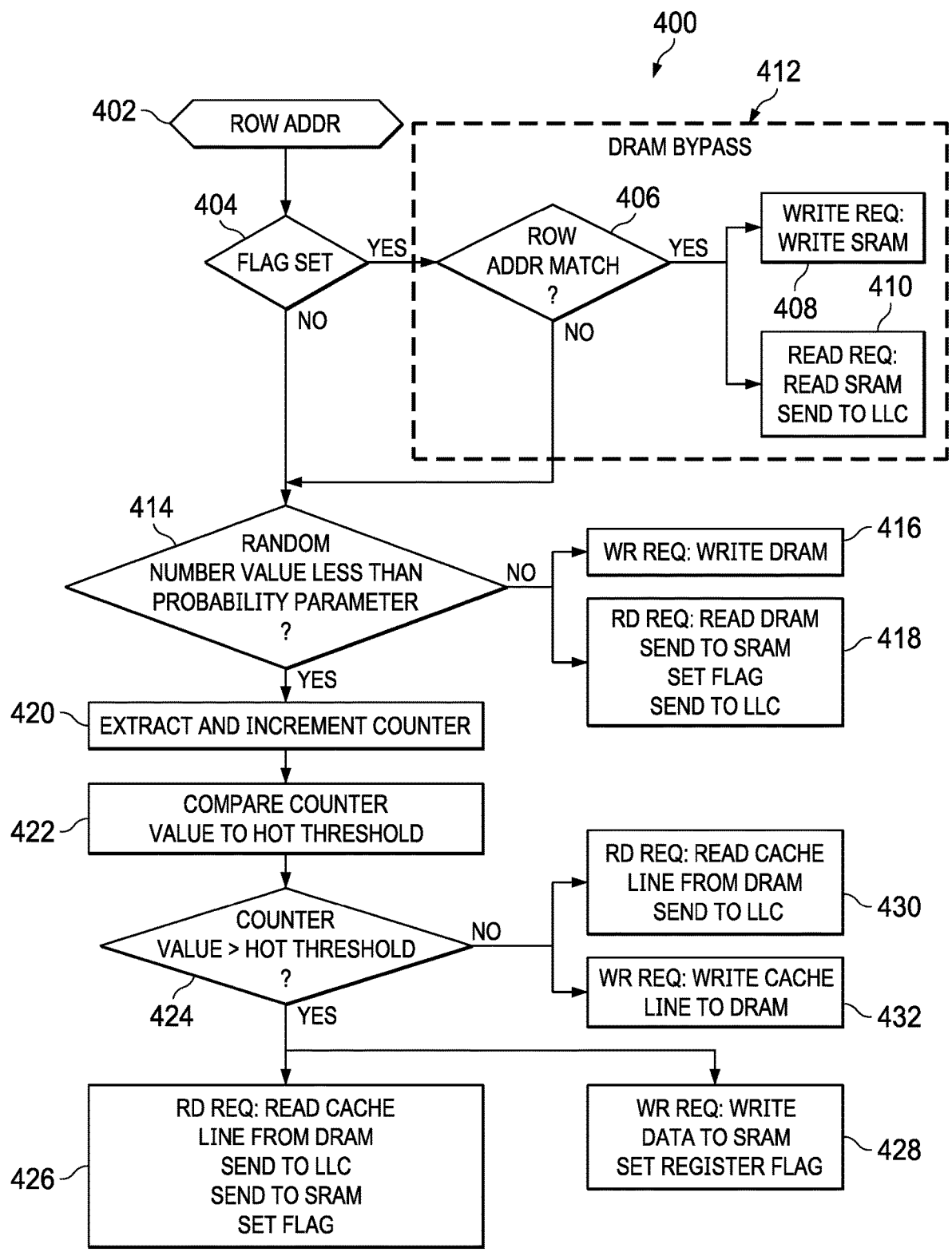
FIG. 4 depicts a high-level flow diagram of a synergic process for accessing memory in accordance with an illustrative embodiment.

Referring now to FIG. 4, a high-level flow diagram 400 depicts a synergic process for accessing memory in accordance with an illustrative embodiment of the disclosure. A memory cycle may be initiated at 402 by the receipt of a row address to the memory controller. The logic controller of PADRAM may check at 404 to determine whether or not a flag is set. The logic controller may set a flag when data is present in locations of the on-chip memory, such as SRAM, and the SRAM is not empty.

If the flag is set at 404 to indicate that data is present in on-chip SRAM memory, the process advances to the DRAM Bypass module at 412. At 406, the process determines whether the row address is available in the SRAM. If a row address match exists in the SRAM, the process continues through the DRAM Bypass 412 and determines whether a write or read request is present. A write request moves the process to 408 where the data packet is stored in the SRAM. A read request moves the process to 410 where cache line data corresponding to the row address is read from the SRAM and sent to the LLC. If a row address match does not exist at 406, then the process falls out of the DRAM bypass 412 and proceeds to the conditional processes starting at 414 that determine read and write accesses to the DRAM.

It is important to note that the objective of the invention is to mitigate crosstalk by reducing the number of accesses to such as main memory or DRAM, thus avoiding disturbance. This objective is achieved by the DRAM bypass of 412 that writes and reads data to and from an on-chip SRAM memory without having to access main memory such as a DRAM. Thus, the DRAM bypass of 412 cuts the number of accesses to main memory.

If the flag is not set at 404 to indicate that data is present in on-chip SRAM memory, the process proceeds to a conditional process at 414 that determines read and write accesses to the DRAM. The condition at 414 checks whether or not a random number generator value is less than a predetermined probability parameter, $RNG\_val < P_{PROB}$. If the result of the condition at 414 is NO, the random number generator value is not less than a predetermined probability parameter and the process checks for the presence of a read request or write request. A write request moves the process to 416 to write the cache line to the corresponding row address location in the DRAM. A read request moves the process to 418 where a data packet corresponding to the row address at 402 is fetched from the DRAM and sent to the SRAM. The logic controller of PADRAM sets a flag to indicate the presence of data in SRAM. The data packet is also sent to the LLC.

If the result of the condition 414 is YES, the random number generator value is less than a predetermined probability parameter, the counter bits of the data packet are extracted and incremented at 420. The process continues at 422 to compare the counter value to a predetermined hot threshold parameter. The condition at 424 checks if the counter value is greater than the hot threshold. If the result of the condition at 424 is YES, the counter value is greater than the hot threshold. A read request moves the process from 424 to 426 and a write request moves the process from 424 to 428. At 426, the read request reads the cache line from the DRAM and sends the cache line to the LLC. The cache line is also stored in the SRAM. The logic controller sets a flag to indicate the presence of data in the SRAM. At 428, the write request writes the cache line data with the updated counter value to the SRAM. The logic controller sets a flag to indicate the presence of data in the SRAM.

If the result of the condition at 424 is NO, the counter value is not less than the hot threshold. A read request moves the process to 430 and a write request moves the process to 432. At 430, a read request reads the cache line data from the DRAM and sends it to the LLC. At 432, a write request writes the cache line data to the DRAM.

Figure 5:
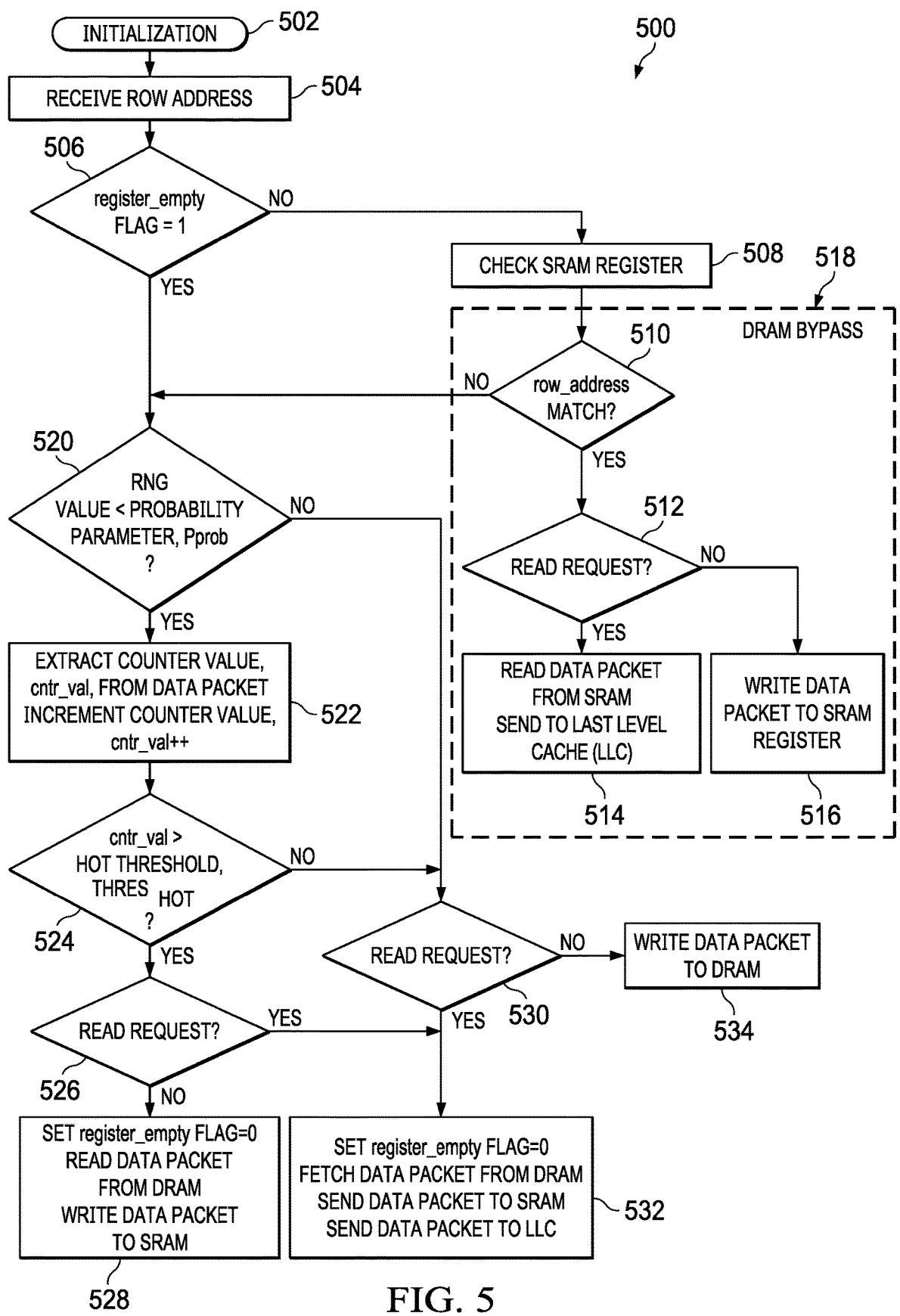
FIG. 5 depicts a detailed flowchart of the method that illustrates the mechanism for mitigating crosstalk in using a combined probabilistic and deterministic mechanism in accordance with an illustrative embodiment.

Turning now to FIG. 5, a detailed flowchart 500 of the method illustrates the mechanism for mitigating crosstalk by using a combined probabilistic and deterministic mechanism in accordance with an illustrative embodiment.

On initialization by the memory controller at 502, a row address is received into the controller at 504. At 506, the memory controller may check whether or not the logic controller has set a flag, register_empty. If the register_empty flag is set at 506, register_empty flag=1, the process moves to a first condition 520 that determines read and write accesses to the DRAM.

If the register_empty flag is not set at 506, the process continues through 508 and the SRAM register is again checked for data at 510. The process then enters the DRAM bypass 518. In DRAM bypass 518, the process at 510 determines whether or not the row address received at 504 is available in the SRAM. If the row address is available in the SRAM at 510, the process proceeds to 512 where it determines whether a write or read request is present. A read request moves the process from 512 to a procedure at 514 where a data packet is read from the location in the SRAM corresponding to the row address and sent to the last level cache (LLC). Alternatively, a write request moves the process from 512 to a procedure at 516 where the data packet is written to a location corresponding to the row address in the SRAM register.

Moving back to the beginning of the DRAM bypass at 518, if a row address match does not exist in the SRAM at 510, the process falls out of the DRAM bypass 518 and proceeds to the first condition 520 that determines read and write accesses to the DRAM.

The first condition at 520 compares the value output by a random number generator to the predetermined probability parameter, $P_{PROB}$. $P_{PROB}$ is a fixed value. If the random number generator value is less than $P_{PROB}$ at 520, then the DRAM may be accessed to read or write data, thus refreshing the line. First, the counter value is extracted from the data packet and incremented at 522. Next, a second condition at 524 checks the counter value against the hotness threshold parameter, $THRES_{HOT}$.

If the counter value is greater than the predetermined hot threshold parameter, the process moves from 524 to 526 where it determines whether a read or write request is present. If a read request is present at 526, the process continues to 532. At 532, a data packet may be read from the corresponding row address location in the DRAM and a copy is stored in the SRAM for future accesses. The register_empty flag may be reset to indicate that data now exists in the SRAM. The data packet may also be sent to the LLC for use by the requesting component. If a write request is present, the process continues to 528. At 528, a data packet may be read from the corresponding row address location in the DRAM and a copy is stored in the SRAM for future accesses request. The register_empty flag is reset to indicate that data now exists in the SRAM.

If the counter value is not greater than the predetermined hot threshold parameter at 524, the process moves from 524 to 530 to determine whether or not a read or write request is present. At 530, a read request continues the process to 532. At 532, a data packet is read from the corresponding row address location in the DRAM and a copy is stored in the SRAM for future accesses. The register_empty flag is reset to indicate that cache line data now exists in the SRAM. The data packet is sent to the LLC for use by the requesting component. At 530, a write request continues the process to 534. At 534, the data packet is written to the corresponding row address location in the DRAM.

Returning back to the first condition at 520, if the random number generator value is not less than the probability parameter, $P_{PROB}$, then the process moves from 520 to 530. At 530, the process determines whether or not a read or write request is present. A read request continues the process from 530 to 532. At 532, a data packet is read from the corresponding row address location in the DRAM and a copy is stored in the SRAM for future accesses. The register_empty flag is reset to indicate that data now exists in the SRAM. The data packet is then sent to the LLC for use by the requesting component. A write request continues the process from 530 to 534. At 534, the data packet is written to the corresponding row address location in the DRAM.

The description of the different illustrative embodiments has been presented for purposes of illustration and description, and is not intended to be exhaustive or limited to the embodiments in the form disclosed. It will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations are contemplated.

Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A computer system, comprising:
at least one processor;
at least one dynamic random-access memory (DRAM) array operatively coupled to the at least one processor, the DRAM array configured to receive a plurality of data packets, each data packet of the plurality of data packets including a counter that tracks access to each row in the DRAM array;
and a memory controller operatively coupled to the at least one processor and comprising an apparatus configured to mitigate crosstalk in the DRAM array.

2. The computer system of claim 1, wherein each data packet of the plurality of data packets comprises a metadata portion that includes an error correcting code portion and a counter portion formed by bytes reclaimed from the error correcting code portion.

3. The computer system of claim 2, wherein the counter portion is a counter that tracks a number of times access is made to the DRAM array.

4. The computer system of claim 3, wherein the memory controller further comprises a memory parameter register that stores device parameters used by the apparatus.

5. The computer system of claim 4, wherein the counter is incremented when a random number generator value is less than a probability device parameter stored in the memory parameter register.

6. The computer system of claim 5, wherein the apparatus configured to mitigate crosstalk comprises:
a random number generator that increments the counter in a probabilistic manner based on the probability device parameter loaded in the memory parameter register;
a logic controller that determines whether or not an access is made to the DRAM array based on a comparison between a value of the counter and a threshold parameter loaded in the memory parameter register; and
a static random-access memory (SRAM) register operatively coupled to the logic controller.

7. The computer system of claim 6, wherein the logic controller comprises a flag to that indicates whether or not the SRAM register is empty.

8. The computer system of claim 7, further comprising:
a last level cache configured to receive a data packet from the SRAM register based on a setting of the flag, a counter output value, the threshold parameter, and a read request.

9. The computer system of claim 8, wherein responsive to a row address match and a read request from the memory controller, the SRAM register sends a data packet to the last level cache and bypasses any access to the DRAM array.

10. The computer system of claim 8, wherein responsive to a row address match and a write request from the memory controller, the SRAM register writes a data packet into a memory location of the SRAM register and bypasses any access to the DRAM array.

11. The computer system of claim 1, wherein each data packet of the plurality of data packets comprises a metadata portion and a counter portion, wherein the counter portion includes the counter that tracks access to each row in the DRAM array.

12. The computer system of claim 11, wherein the counter tracks a number of times access is made to the DRAM array.

13. The computer system of claim 1, wherein the counter is incremented when a random number generator value is less than a probability device parameter.

14. A in a memory controller, comprising:
a counter embedded in a data packet structure that counts a number of accesses to a main memory;
a random number generator that increments the counter in a probabilistic manner based on a probability parameter;
a SRAM register configured for access based on a flag set by the memory controller; and
a logic controller that determines a setting of the flag.

15. The memory controller of claim 14, further comprising a parameter register that stores the probability parameter which determines a refresh interval of a row in main memory.

16. The memory controller of claim 15, wherein the parameter register further comprises a hotness threshold.

17. The memory controller of claim 14, wherein the counter comprises a number of bytes bits reclaimed from a portion of an error code correction feature of the main memory.

18. A method implemented at a memory controller, comprising: receiving a row address into the memory controller; and
determining, based on the row address and a flag set by the memory controller whether to access an on-chip memory or a DRAM array, wherein the determining comprises:
responsive to a row address match in the on-chip memory, accessing the on-chip memory with a cache line of a data packet corresponding to the row address and bypassing all accesses to a DRAM array;
responsive to a row address miss in the on-chip memory, comparing an output of a random number generator with a predetermined probability parameter; and
responsive to the output of the random number generator being less than the predetermined probability parameter, and a counter value of the data packet being greater than a hot threshold parameter, accessing the DRAM array and at least one or more of the on-chip memory and a last level cache.

19. The method of claim 18, wherein the predetermined probability parameter is determined by a ratio N divided by R, where N is a number of activations or accesses possible for the DRAM array having R rows, and the predetermined probability parameter is greater than an inverse of N divided by R, where N and R are positive integers.

20. The method of claim 18, wherein the hot threshold parameter is based on a row hammering threshold and a number of cache lines in a word line of the DRAM array and is selected to be less than the row hammering threshold divided by the number of cache lines per word line of the DRAM array.

* * * * *